United States Patent
Lee et al.

(10) Patent No.: US 11,037,826 B2
(45) Date of Patent: Jun. 15, 2021

(54) SEMICONDUCTOR DEVICE HAVING MERGED EPITAXIAL FEATURES WITH ARC-LIKE BOTTOM SURFACE AND METHOD OF MAKING THE SAME

(71) Applicant: Taiwan Semiconductor Manufacturing Co., Ltd., Hsin-Chu (TW)

(72) Inventors: Yi-Jing Lee, Hsinchu (TW); Jeng-Wei Yu, Hsinchu (TW); Li-Wei Chou, Hsinchu (TW); Tsz-Mei Kwok, Hsinchu (TW); Ming-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/773,268

(22) Filed: Jan. 27, 2020

(65) Prior Publication Data

US 2020/0161185 A1 May 21, 2020

Related U.S. Application Data

(60) Continuation of application No. 16/049,971, filed on Jul. 31, 2018, now Pat. No. 10,546,784, which is a
(Continued)

(51) Int. Cl.
*H01L 29/78* (2006.01)
*H01L 21/822* (2006.01)
(Continued)

(52) U.S. Cl.
CPC .. *H01L 21/8221* (2013.01); *H01L 21/823431* (2013.01); *H01L 21/823821* (2013.01);
(Continued)

(58) Field of Classification Search
CPC . H01L 27/06; H01L 27/0688; H01L 27/0686; H01L 27/0924; H01L 27/41791;
(Continued)

(56) References Cited

U.S. PATENT DOCUMENTS 7,667,271 B2   2/2010   Yu et al.
8,263,451 B2   9/2012   Su et al.
(Continued)

FOREIGN PATENT DOCUMENTS

KR     20140029094     3/2014

*Primary Examiner* — Chuong A Luu
(74) *Attorney, Agent, or Firm* — Haynes and Boone, LLP

(57) ABSTRACT

A semiconductor device and method of forming the same is disclosed. The semiconductor device includes a semiconductor substrate, a first fin and a second fin extending from the semiconductor substrate, a first lower semiconductor feature directly over the first fin, and a second lower semiconductor feature directly over the second fin. Each of the first and second lower semiconductor features includes a top surface bending downward towards the semiconductor substrate. The semiconductor also further includes an upper semiconductor feature directly over and in physical contact with the first and second lower semiconductor features. The semiconductor device further includes a dielectric layer on sidewalls of the first and second lower semiconductor features.

20 Claims, 15 Drawing Sheets

Related U.S. Application Data division of application No. 15/594,842, filed on May 15, 2017, now Pat. No. 10,049,936.

(60) Provisional application No. 62/495,612, filed on Dec. 15, 2016.

(51) Int. Cl.

| | | |
|---|---|---|
| *H01L 21/8234* | (2006.01) | |
| *H01L 21/8238* | (2006.01) | |
| *H01L 27/088* | (2006.01) | |
| *H01L 27/092* | (2006.01) | |
| *H01L 29/66* | (2006.01) | |
| *H01L 29/417* | (2006.01) | |
| *H01L 21/84* | (2006.01) | |
| *H01L 27/06* | (2006.01) | |

(52) U.S. Cl.
CPC .......... H01L 21/84 (2013.01); H01L 27/0688 (2013.01); H01L 27/0886 (2013.01); H01L 27/0924 (2013.01); H01L 29/41791 (2013.01); H01L 29/66795 (2013.01); H01L 29/7851 (2013.01); *H01L 21/823814* (2013.01); *H01L 21/823871* (2013.01)

(58) Field of Classification Search
CPC ........... H01L 27/66795; H01L 27/7851; H01L 27/092; H01L 21/84; H01L 21/822; H01L 21/8221; H01L 21/823431; H01L 21/823821; H01L 21/823814; H01L 21/823871; H01L 27/10826; H01L 27/10879; H01L 29/7851; H01L 29/66; H01L 29/66795; H01L 29/41791; H01L 29/417; H01L 29/78; H01L 29/785; H01L 21/8234; H01L 21/8238; H01L 21/7858
USPC ......................................................... 257/20
See application file for complete search history.

(56) References Cited

U.S. PATENT DOCUMENTS

| | | | |
|---|---|---|---|
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,703,556 B2 | 4/2014 | Kelly et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,287,264 B1 | 3/2016 | Cheng et al. | |
| 9,287,382 B1 | 3/2016 | Lee et al. | |
| 2011/0068407 A1 | 3/2011 | Yeh et al. | |
| 2012/0001197 A1* | 1/2012 | Liaw ...................... | H01L 27/11 257/77 |
| 2012/0091538 A1 | 4/2012 | Lin et al. | |
| 2012/0153387 A1 | 6/2012 | Murthy et al. | |
| 2013/0011983 A1 | 1/2013 | Tsai et al. | |
| 2013/0171790 A1 | 7/2013 | Wang | |
| 2014/0065782 A1 | 3/2014 | Lu et al. | |
| 2014/0134824 A1 | 5/2014 | Chen et al. | |
| 2014/0252412 A1 | 9/2014 | Tsai et al. | |
| 2014/0299934 A1 | 10/2014 | Kim et al. | |
| 2015/0194503 A1 | 7/2015 | Ching et al. | |
| 2015/0303118 A1* | 10/2015 | Wang .............. | H01L 21/823431 257/401 |
| 2016/0190017 A1 | 6/2016 | Lee et al. | |
| 2016/0268171 A1 | 9/2016 | Wei et al. | |
| 2016/0315172 A1 | 10/2016 | Wu et al. | |
| 2017/0186748 A1 | 6/2017 | Lee et al. | |
| 2017/0243868 A1 | 8/2017 | Lee et al. | |

\* cited by examiner

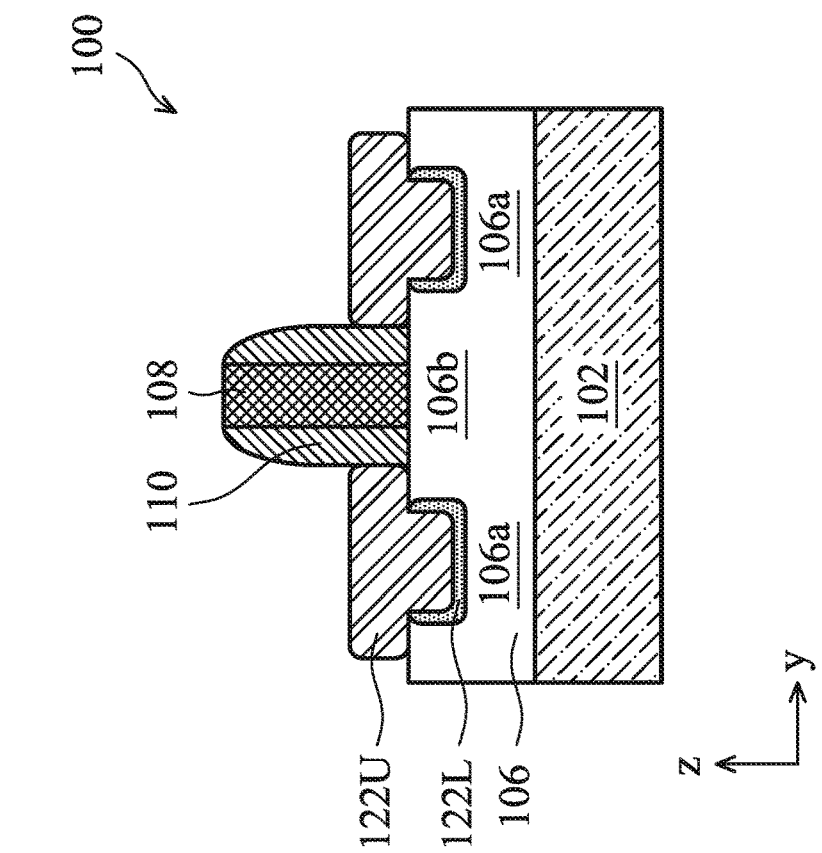
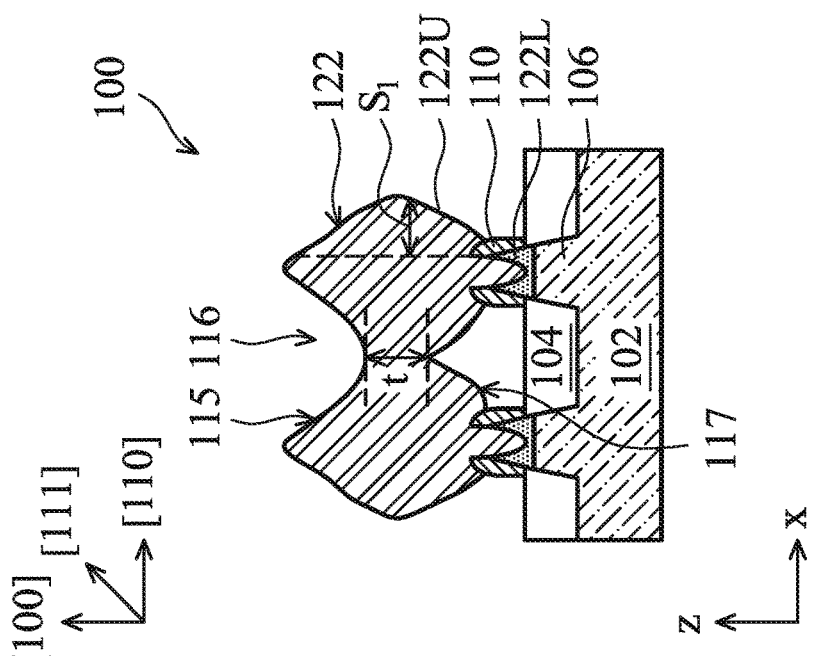
FIG. 8A
FIG. 8B

SEMICONDUCTOR DEVICE HAVING MERGED EPITAXIAL FEATURES WITH ARC-LIKE BOTTOM SURFACE AND METHOD OF MAKING THE SAME

PRIORITY

This is a continuation application of U.S. patent application Ser. No. 16/049,971, filed Jul. 31, 2018, which is a divisional application of U.S. patent application Ser. No. 15/594,842, filed May 15, 2017, issued U.S. Pat. No. 10,049, 936, which claims priority to U.S. Prov. Pat. App. Ser. No. 62/495,612, filed Dec. 15, 2016, herein incorporated by reference in its entirety.

CROSS-REFERENCE TO RELATED APPLICATIONS

This application is related to commonly-assigned U.S. patent application Ser. No. 15/277,478, entitled "FinFET Device Having Flat-Top Epitaxial Features and Method of Making the Same," filed Sep. 27, 2016.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices are scaled down progressively, strained source/drain (S/D) features (e.g., stressor regions) have been implemented using epitaxial (epi) semiconductor materials to enhance carrier mobility and improve device performance. Forming a metal-oxide-semiconductor field effect transistor (MOSFET) with stressor regions often epitaxially grows silicon (Si) to form raised S/D features for an n-type device, and epitaxially grows silicon germanium (SiGe) to form raised S/D features for a p-type device. Various techniques directed at shapes, configurations, and materials of these S/D features have been implemented to further improve transistor device performance. Although existing approaches in S/D formation have been generally adequate for their intended purposes, they have not been entirely satisfactory in all respects. For example, S/D contact resistance has become an increasingly prominent factor in circuit performance as the transistors are scaled down. It is highly desirable to have reduced S/D contact resistance as it leads to reduced power consumption and faster circuit speed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 4B, 4C, 5A, 5B, 5C, 6A, 6B, 7A, 7B, 8A, 8B, 9A, 9B, 10A, 10B, 11A, 11B, 12A, 12B, 13A, and 13B illustrate cross sectional views of forming a target semiconductor device according to the method of FIG. 2, in accordance with some embodiments.

DETAILED DESCRIPTION

Figure 1B:
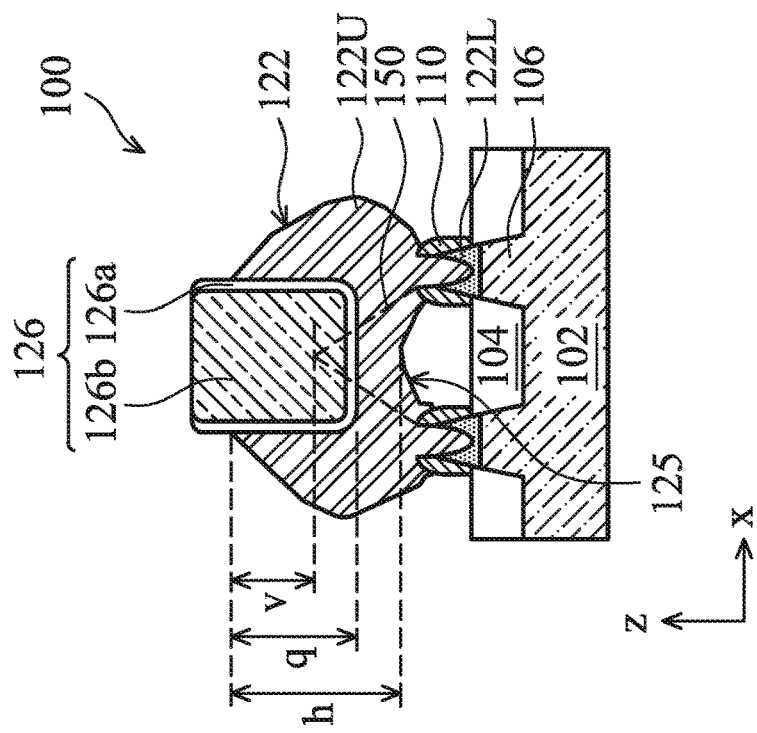
FIGS. 1A, 1B, 1C, 1D, and 1E illustrate various embodiments of a semiconductor device constructed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to semiconductor devices and methods of forming the same. In particular, the present disclosure is related to forming raised S/D features in field effect transistors (FETs) including FETs having fin-like channels (known as FinFETs). In some embodiments, the present disclosure provides raised S/D features that are a result of merging multiple epitaxial features, wherein the raised S/D features have an arc-like bottom surface. Further, the raised S/D features may have a flat or nearly flat top surface. Having the arc-like bottom surface provides large volume in the raised S/D features when the raised S/D features are etched for forming conductive features such as S/D contacts. The large volume helps reduce the interfacial resistance between the raised S/D features and the conductive features.

Figure 1A:
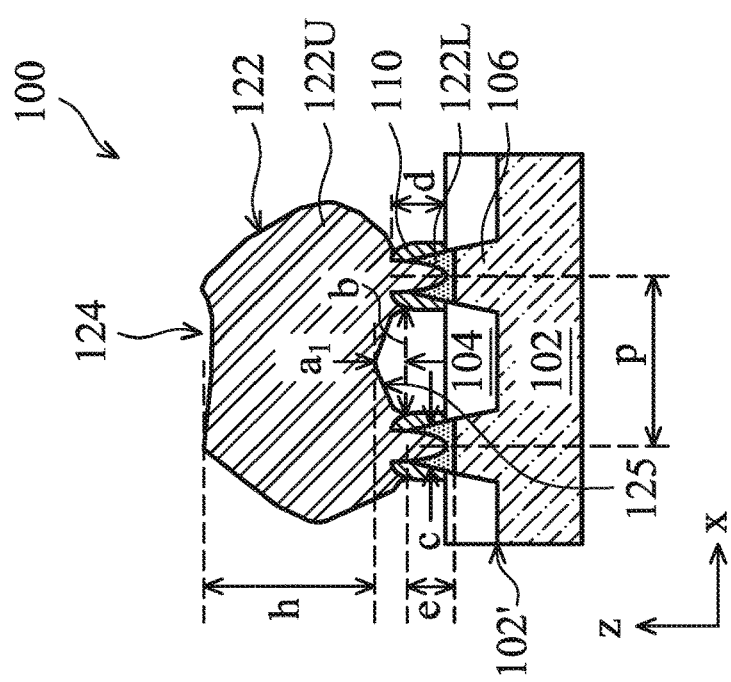

FIG. 1A shows a semiconductor device 100 constructed according to various aspects of the present disclosure. The device 100 may be an intermediate device fabricated during processing of an IC, or a portion thereof, that may comprise static random access memory (SRAM) and/or logic circuits, passive components such as resistors, capacitors, and inductors, and active components such as p-type FETs (PFETs), n-type FETs (NFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, fins, gate stacks, device regions, and other features in various embodiments of the present disclosure are provided for simplification and ease of understanding and do not necessarily limit the embodiments to any types of devices, any number of devices, any number of regions, or any configuration of structures or regions. Even though illustrated as a FinFET device in various embodiments, the device 100 can also be planar FET devices and other multi-gate devices in alternative embodiments.

FIG. 1A is a cross-sectional view of the device 100 in an S/D region thereof. Referring to FIG. 1A, in this embodiment, the device 100 includes a substrate 102, an isolation structure 104 over the substrate 102, and two or more fins 106 (two shown in FIG. 1A) over the substrate 102. The fins 106 extend lengthwise perpendicular to the "x-z" plane. Even though not shown, some portions of the fins 106 may protrude above the isolation structure 104. Further in this embodiment, the device 100 includes an epitaxially grown semiconductor feature (or epitaxial feature) 122. The epitaxial feature 122 comprises an upper portion 122U and two or more lower portions 122L (two shown in FIG. 1A). The lower portions 122L are disposed over the respective fins 106 and are at least partially surrounded by a fin sidewall dielectric layer 110. In the present embodiment, the lower portions 122L are lower than the fin sidewall dielectric layer 110 along the "z" direction (the fin height direction). The lower portions 122L are physically connected to each other through the upper portion 122U. The upper portion 122U provides a top surface 124 which is flat or nearly flat. In an embodiment, the top surface 124 is substantially parallel to a top surface 102' of the substrate 102. In the present embodiment, a bottom surface 125 of the upper portion 122U has an arc-like cross-sectional shape in the "x-z" plane. The various features of the device 100 are further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a buried dielectric layer. In embodiments, the substrate 102 includes active regions such as p-wells and n-wells for forming active devices.

The fins 106 may be p-type fins for forming PFETs or n-type fins for forming NFETs. The fins 106 may comprise substantially the same semiconductor material as the substrate 102. Although not shown in FIG. 1A, each of the fins 106 includes a channel region and two S/D regions sandwiching the channel region. FIG. 1A shows a sectional view of the device 100 cut across one of the S/D regions of the fins 106. The fins 106 are separated by the isolation structure 104. The isolation structure 104 may comprise silicon oxide, silicon nitride, silicon oxynitride, fluoride-doped silicate glass (FSG), a low-k dielectric material, and/or other suitable insulating material. The isolation structure 104 may be shallow trench isolation (STI) features in some embodiments. The dielectric layer 110 is disposed over the isolation structure 104 and adjacent to the S/D regions of the fins 106. The dielectric layer 110 at least partially surrounds lower portions 122L. In an embodiment, the dielectric layer 110 comprises a nitride such as silicon nitride, silicon oxynitride, or silicon carbon nitride. The upper portion 122U is disposed over the dielectric layer 110 and the lower portions 122L.

In an embodiment, the lower portions 122L and the upper portion 122U each include silicon doped with an n-type dopant, such as phosphorus (P) or arsenic (As), for forming NFET devices. Further, the upper portion 122U comprises a higher concentration of the n-type dopant than the lower portions 122L do. In one example, the upper portion 122U comprises silicon doped with phosphorus having a dopant concentration ranging from $1e^{21}$ cm$^{-3}$ to $5e^{21}$ cm$^{-3}$, while the lower portions 122L comprise silicon doped with phosphorus having a dopant concentration ranging from $1e^{20}$ cm$^{-3}$ to $1e^{21}$ cm$^{-3}$. In another embodiment, the lower portions 122L and the upper portion 122U each include silicon germanium doped with a p-type dopant, such as boron (B) or indium (In), for forming PFET devices. In a further embodiment, the upper portion 122U comprises a higher concentration of the p-type dopant than the lower portions 122L do.

In the embodiment shown in FIG. 1A, the fins 106 have a fin pitch "p" along the fin width direction (the "x" direction). The fin pitch "p" is also the pitch of the lower portions 122L. In embodiments, the pitch "p" is tuned for the process node and for forming the particular shape of the epitaxial feature 122. If "p" is too small, the upper portion 122U may merge early in the epitaxial growth process such that it tends to grow into a rhombus shape, instead of a shape having a flat top surface and an arc-like bottom surface. If "p" is too big, the upper portion 122U may not merge at all. In an example, the pitch "p" is tuned to range from 30 nanometers (nm) to 50 nm. Further, the upper portion 122U has a vertical thickness (along the "z" direction) of "h" from the peak of the arc shape of the bottom surface 125 to the top surface 124. In an example, the thickness "h" ranges from 25 to 55 nm. The dielectric layer 110 has a height "d" along the "z" direction, and the height "d" may range from 5 to 25 nm in various embodiments. As will be discussed below, the height "d" contributes to the various shapes and dimensions of the epitaxial feature 122. The lower portions 122L each have a width "c" along the "x" direction, measured at approximately the half-height of the lower portion 122L. The width "c" may range from 6 to 15 nm in some embodiments. Further, the lower portions 122L each have a height "e" along the "z" direction. The height "e" may range from 3 to 15 nm in some embodiments.

Still referring to FIG. 1A, there is space between the upper portion 122U, the sidewall dielectric layer 110, and the isolation structure 104. This space may be completely or partially filled with an inter-layer dielectric (ILD) layer (not shown in FIG. 1A, but see feature 130 of FIG. 13A). In an embodiment, the ILD layer comprises a different material than the sidewall dielectric layer 110. For example, the ILD layer may comprise tetraethylorthosilicate (TEOS) oxide, doped or un-doped silicate glass, or fused silica glass (FSG), while the sidewall dielectric layer 110 comprises a nitride.

The arc shape of the bottom surface 125 may extend upward away from the substrate 102, like shown in FIG. 1A. In an alternative embodiment, the arc shape may extend downward towards the substrate 102, such as shown in FIG. 1D to be discussed later. The arc has a span "b" along the "x" direction and a height (or rise) "$a_1$" along the "z" direction in the present embodiment. In an example where the pitch "p" ranges from 30 to 50 nm, the span "b" is about 20 to 40 nm while the height "$a_1$" is about 0 to 10 nm. In the present embodiment, the bottom surface 125 has a shallow arc-like shape, i.e., the height-to-span ratio of the arc, $a_1/b$, is less than 0.5. In a further embodiment, the ratio of $a_1/b$ is less than 0.25. The advantages and effects of having a small height-to-span ratio will become clear by referring to FIG. 1B.

Referring to FIG. 1B, in an embodiment, the device 100 further includes a conductive feature 126 formed over the epitaxial feature 122. Particularly in this embodiment, the conductive feature 126 is partially embedded in the upper portion 122U of the epitaxial feature 122. In the present embodiment, the conductive feature 126 includes a barrier layer 126a and a conductor (e.g., a metal) 126b over the barrier layer. For example, the conductor 126b may include aluminum (Al), tungsten (W), copper (Cu), cobalt (Co), combinations thereof, or other suitable material; and the barrier layer 126a may include a metal nitride, such as TaN or TiN. The conductive feature 126 may include additional layers. In another embodiment, the conductive feature 126 includes doped polysilicon. The conductive feature 126 may be an S/D contact or an S/D local interconnect line. Forming of the conductive feature 126 includes etching a trench into the epitaxial feature 122 and depositing layer(s) of the conductive feature 126 into the trench. The trench may be etched to have a depth "q" into the epitaxial feature 122, which is less than the thickness "h" of the upper portion 122U (along the "z" direction). In some embodiments, the depth "q" ranges from 15 to 25 nm. Even though not shown, there may be a silicide feature (or silicidation) between the conductive feature 126 and the epitaxial feature 122 in some embodiments.

In various embodiments, the large interfacial area between the conductive feature 126 and the epitaxial feature 122 provides reduced contact resistance compared with traditional structures. Traditional epitaxial features typically have a rhombus-like cross-sectional profile and are either isolated from each other (unmerged), or merged into a shape with a sharply pointed vault as illustrated by the dashed lines 150 in FIG. 1B. Isolated epitaxial features do not provide as large an interfacial area as the merged epitaxial features. Sharply pointed vault in merged epitaxial features does not provide sufficient volume for etching, for example, when forming the trench for depositing the conductive feature 126. For example, when an epitaxial feature's vertical thickness "v" is less than the trench depth "q," the epitaxial feature would be etched through. If the epitaxial feature is etched through, some area of the conductive feature 126 would not contact the epitaxial feature, leading to increased contact resistance.

Such over-etching might become more severe with today's advanced process nodes where the aspect ratio of transistor topography is on a rise. The aspect ratio refers to the ratio between the height of the transistor topography peaks (e.g., gate stacks) and the space between adjacent peaks. In some examples, this aspect ratio has become 10 or more as device integration continues. During the etching for S/D contacts or local S/D interconnect lines, etchant chemistry or etching time may be tuned for certain over-etching in order to reach the S/D features which are typically located at the bottom of the transistor topography. Having a sharply pointed vault in the epitaxial feature might not provide a large enough volume to withstand such over-etching. In contrast, having an arc-like bottom 125 with a small height-to-span ratio (e.g. 0.25 or less) advantageously increases the volume of the merged epitaxial feature 122 to withstand such over-etching.

Figure 1C:
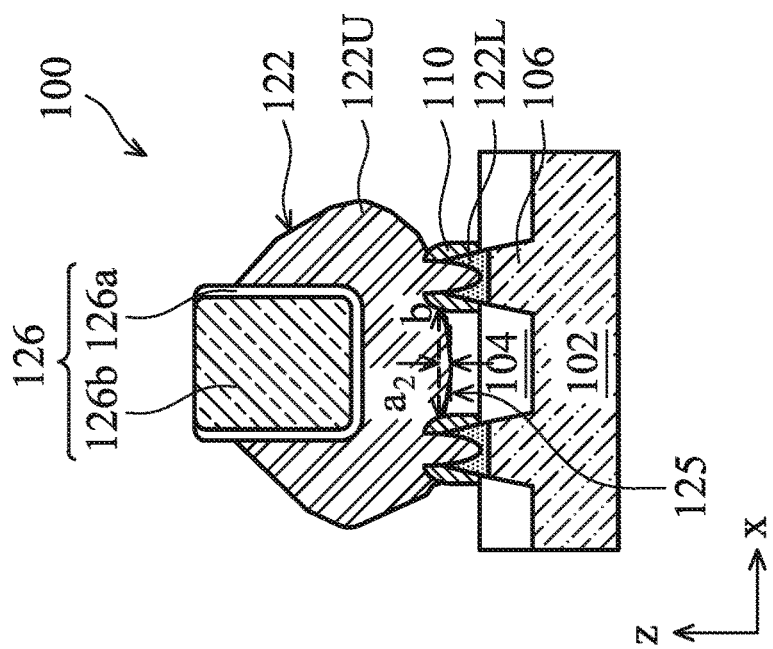
Figure 1D:
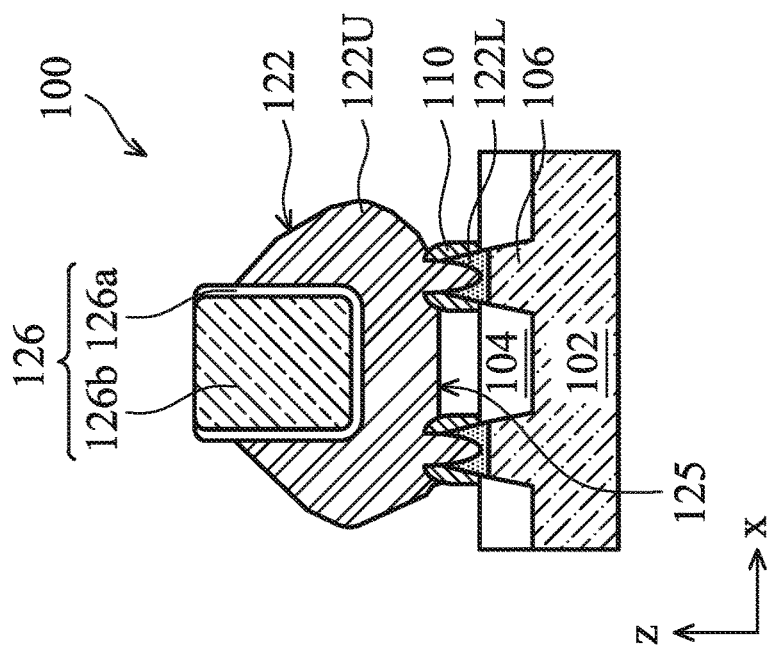

Referring to FIG. 1C, shown therein is another embodiment of the device 100 where the bottom surface 125 is flat or nearly flat. Other aspects of this embodiment are the same as or similar to those of FIG. 1B.

Referring to FIG. 1D, shown therein is yet another embodiment of the device 100 where the bottom surface 125 has a downward extending arc-like shape. The arc has a span "b" along the "x" direction and a height (or depth) $a_2$ along the "z" direction. In some embodiments, the height-to-span ratio, $a_2/b$, is less than 0.5, such as less than 0.25. In embodiments, the span "b" ranges from 20 to 40 nm and the height "$a_2$" ranges from 0 to 10 nm. Other aspects of this embodiment are the same as or similar to those of FIG. 1B. In each of FIGS. 1B, 1C, and 1D, the conductive features 126 are shown to be completely or partially embedded in the upper portion 122U. However, this is not limiting. In some other embodiments, the conductive features 126 may be disposed on the top surface 124 of the epitaxial feature 122.

Figure 1E:
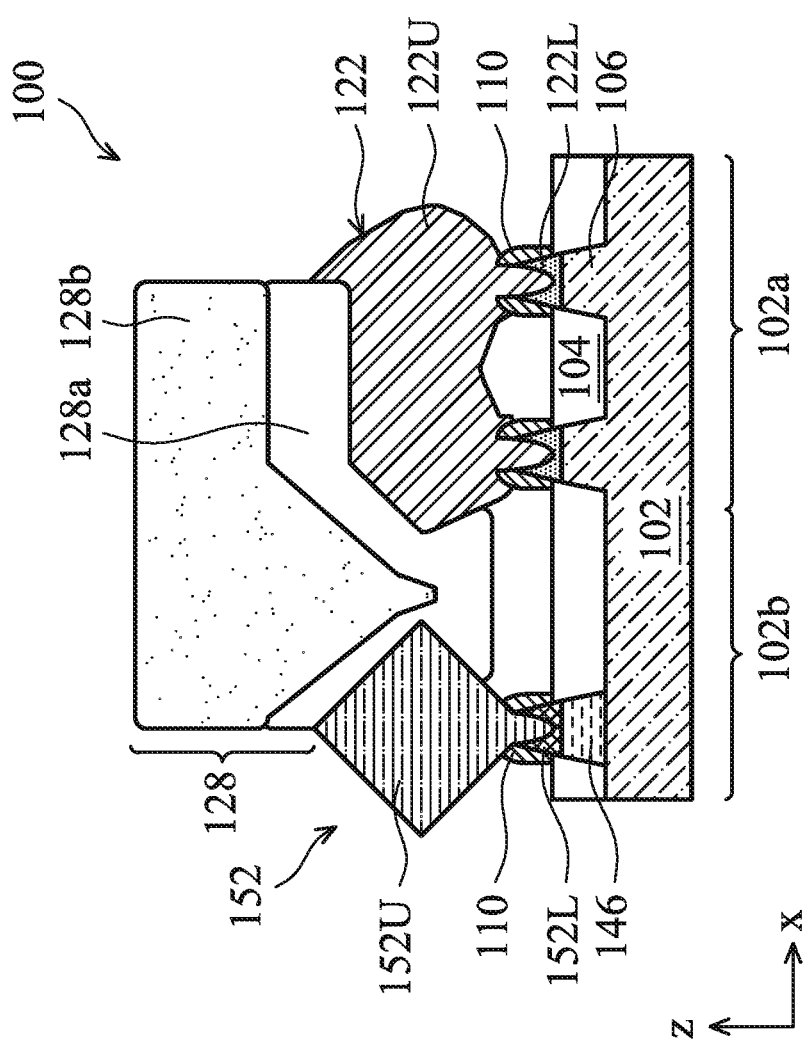

Referring to FIG. 1E, in another embodiment, the device 100 includes a region 102a and an adjacent region 102b. The region 102a includes the various features 106 and 122 discussed above. The region 102b includes a fin 146 and an epitaxial feature 152 over the fin 146. The epitaxial feature 152 comprises a lower portion 152L and an upper portion 152U over the lower portion 152L. The dielectric layer 110 at least partially surrounds the lower portion 152L. In the present embodiment, the lower portion 152L is lower than the fin sidewall dielectric layer 110 along the "z" direction. The upper portion 152U is disposed over the dielectric layer 110. Further in this embodiment, the device 100 includes a conductive feature 128 that interfaces with both the epitaxial features 122 and 152. The conductive feature 128 includes a barrier layer 128a and a conductor (e.g., a metal) 128b over the barrier layer 128a. The barrier layer 128a and the conductor 128b may have the same or similar composition as the barrier layer 126a and the conductor 126b, respectively. In this embodiment shown, the epitaxial feature 152 has a rhombus shaped cross-sectional profile and a portion of the conductive feature 128 is disposed over a side of the epitaxial feature 152. Particularly in this embodiment, a portion of the conductive feature 128 is disposed between the epitaxial features 122U and 152U and below the widest part (along the "x" direction) of the epitaxial feature 122U and/or the epitaxial feature 152U. In another embodiment, the region 102b may include epitaxial features that are shaped like the epitaxial feature 122, i.e., having a flat or nearly flat top surface and an arc-like bottom surface. In an embodiment, the features in the region 102a form an n-type transistor (e.g., NMOS) and the features in the region 102b form a p-type transistor (e.g., PMOS). In an alternative embodiment, the features in the region 102a form a p-type transistor (e.g., PMOS) and the features in the region 102b form an n-type transistor (e.g., NMOS).

Figure 2:
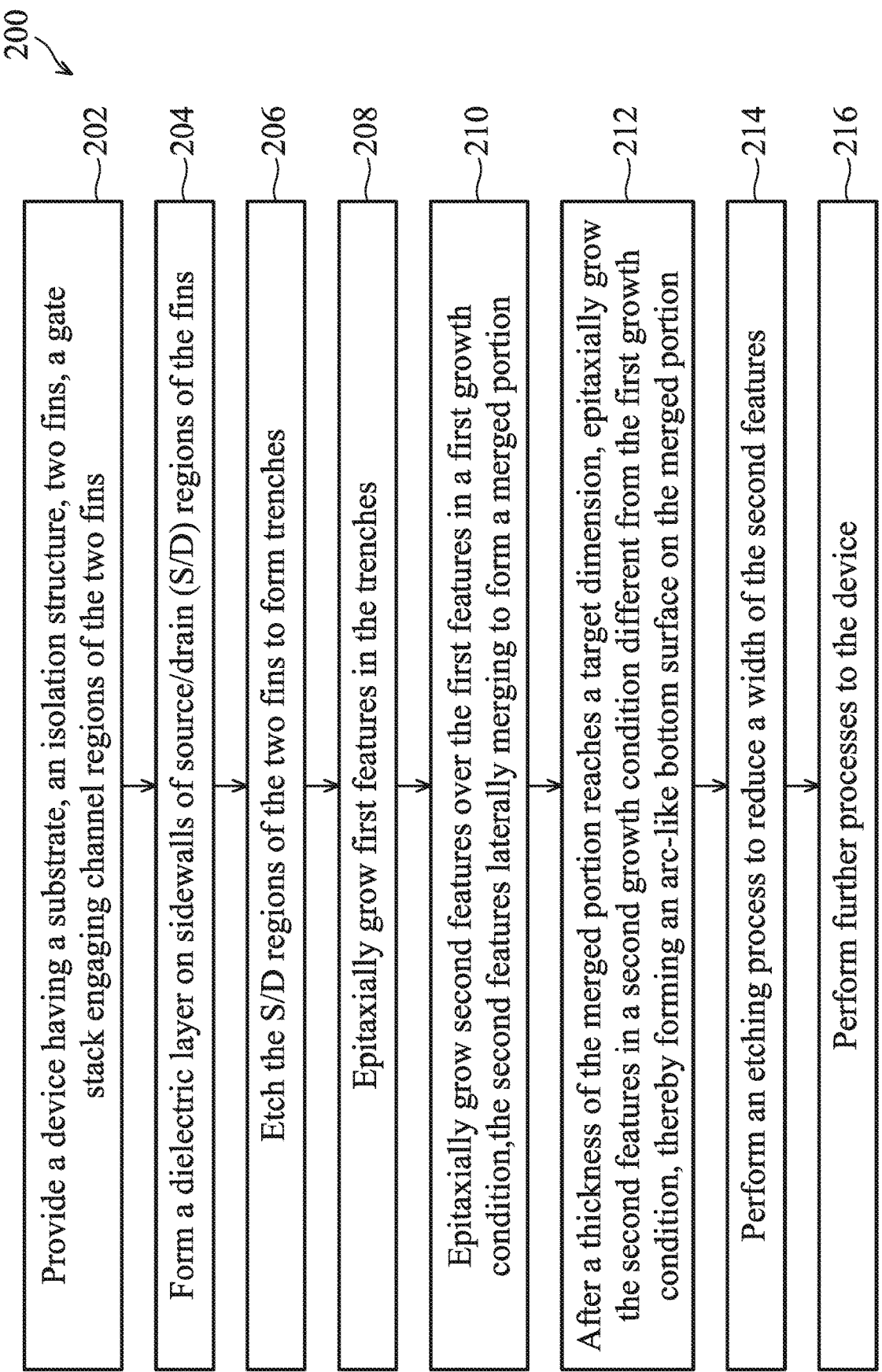
FIG. 2 shows a block diagram of a method of forming a semiconductor device, according to various aspects of the present disclosure.

FIG. 2 shows a block diagram of a method 200 of forming a semiconductor device, such as the semiconductor device 100, according to various aspects of the present disclosure. The method 200 is an example, and is not intended to limit the present disclosure beyond what is explicitly recited in the claims. Additional operations can be provided before, during, and after the method 200, and some operations described can be replaced, eliminated, or relocated for additional embodiments of the method. The method 200 is described below in conjunction with FIGS. 3-13B which are perspective and cross-sectional views of the semiconductor device 100 according to various aspects of the present disclosure.

Figure 3:
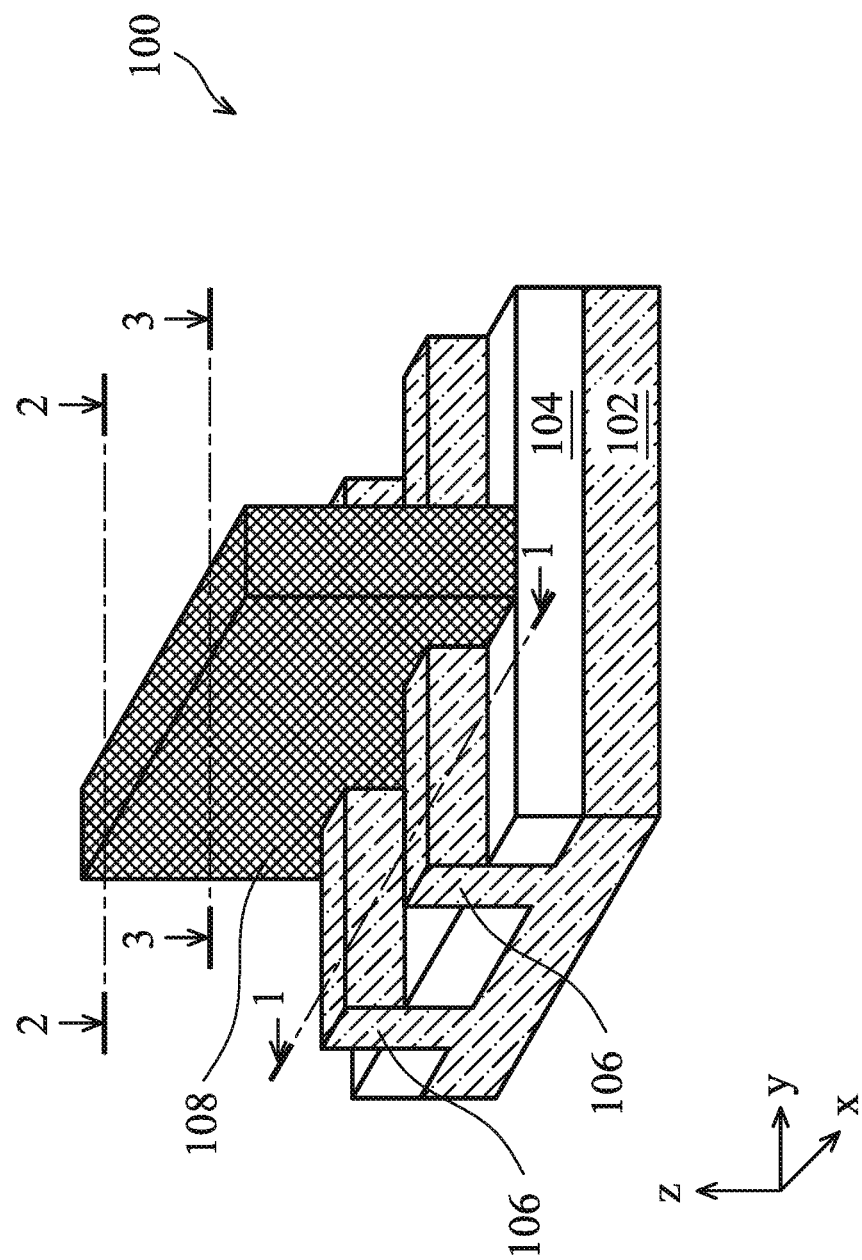
FIG. 3 illustrates a perspective view of a semiconductor device in an intermediate step of fabrication according to an embodiment of the method of FIG. 2.
Figure 4A:
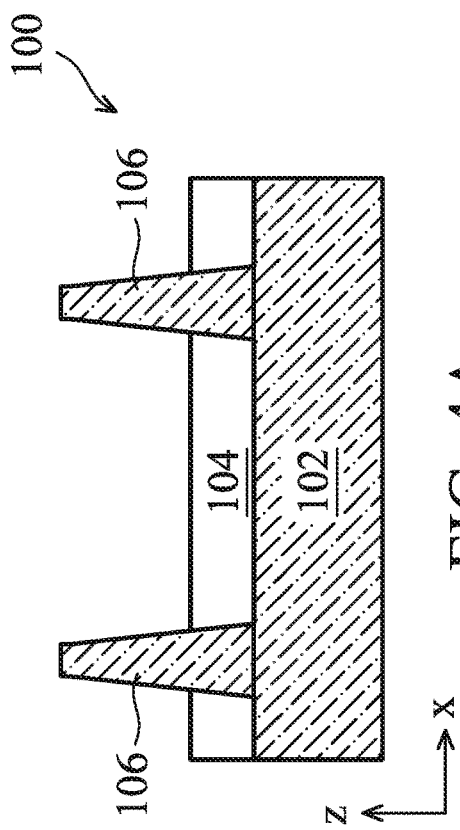
Figure 4B:
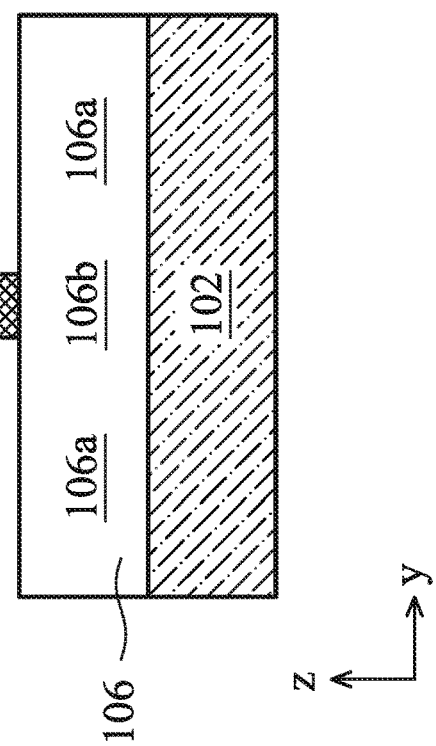
Figure 4C:
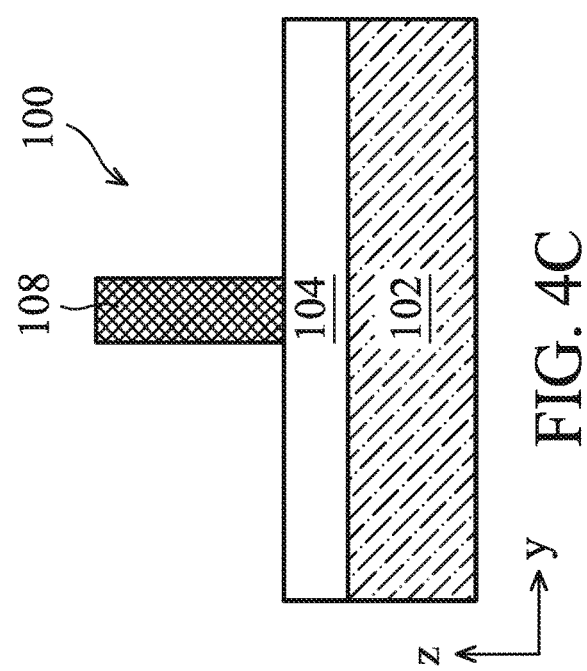

At operation 202, the method 200 (FIG. 2) receives the device 100 at an intermediate fabrication stage. FIG. 3 shows a perspective view of the device 100. FIGS. 4A, 4B, and 4C show cross-sectional views of the device 100 along the "1-1," "2-2," and "3-3" lines in FIG. 3 respectively. The "1-1" line cuts the device 100 in the "x-z" plane in S/D regions of the fins 106. The "2-2" line cuts the device 100 in the "y-z" plane along a length of the fins 106. The "3-3" line cuts the device 100 in the "y-z" plane outside the fins 106. Referring to FIGS. 3, 4A, 4B, and 4C collectively, the device 100 includes the substrate 102, the isolation structure 104 over the substrate 102, and the two fins 106 extending from the substrate 102 and through the isolation structure 104. The two fins 106 each have two source/drain (S/D) regions 106a and a channel region 106b interposing the S/D regions 106a. The device 100 further includes a gate stack 108 engaging the fins 106 in the channel regions 106b. Particularly, the gate stack 108 engages the fins 106 on multiple sides thereof, forming a multi-gate device (a Fin-FET in this case).

The fins 106 may be fabricated using suitable processes including photolithography and etching processes. The photolithography process may include forming a resist (or photoresist) overlying the substrate 102, exposing the resist to a pattern, performing post-exposure bake processes, and developing the resist to form a masking element including the resist. The masking element is then used for etching recesses into the substrate 102, leaving the fins 106 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The fins 106 may also be formed using double-patterning lithography (DPL) processes. Numerous other embodiments of methods to form the fins 106 may be suitable.

The isolation structure 104 may be formed by etching trenches in the substrate 102, e.g., as part of the fins 106 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 104 may include a multi-layer structure, for example, having one or more thermal oxide liner layers.

The gate stack 108 includes a gate dielectric layer and a gate electrode layer. The gate dielectric layer may include silicon oxide or a high-k dielectric material such as hafnium oxide, zirconium oxide, lanthanum oxide, titanium oxide, yttrium oxide, and strontium titanate. The gate dielectric layer may be formed by chemical oxidation, thermal oxidation, atomic layer deposition (ALD), chemical vapor deposition (CVD), and/or other suitable methods. In an embodiment, the gate electrode layer includes polysilicon, and may be formed by suitable deposition processes such as low-pressure chemical vapor deposition (LPCVD) and plasma-enhanced CVD (PECVD). In some embodiments, the gate electrode layer includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer may be formed by CVD, PVD, plating, and/or other suitable processes. In some embodiments, the gate stack 108 is a sacrificial gate structure, i.e., a placeholder for a final gate stack. In some embodiments, the gate stack 108 includes an interfacial layer between its gate dielectric layer and the fins 106. The interfacial layer may include a dielectric material such as silicon oxide or silicon oxynitride, and may be formed by chemical oxidation, thermal oxidation, ALD, CVD, and/or other suitable dielectric. The gate stack 108 may include other layers such as hard mask layer(s).

Figure 5B:
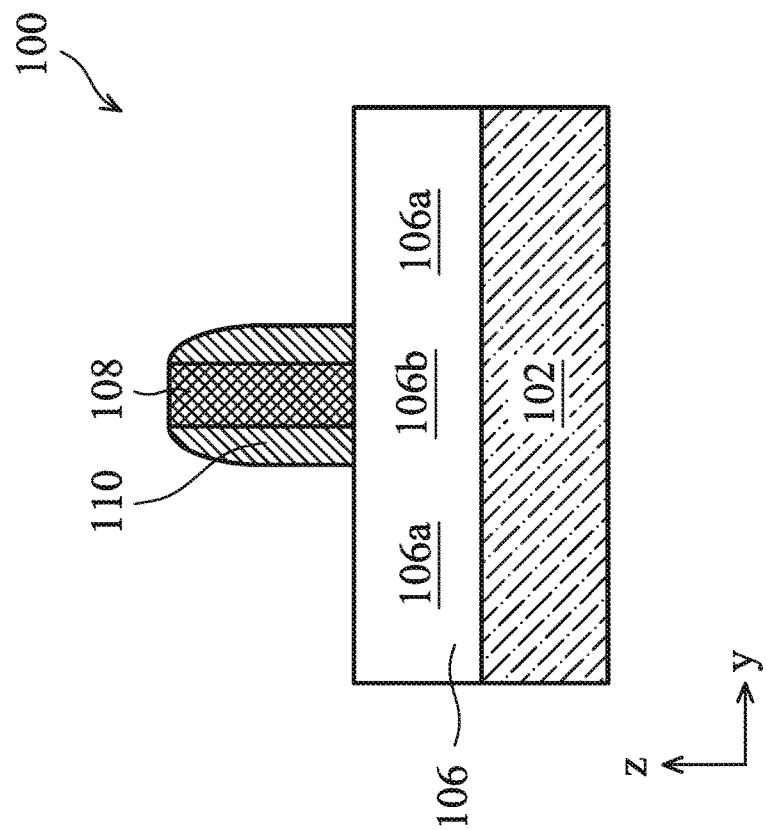
Figure 5A:
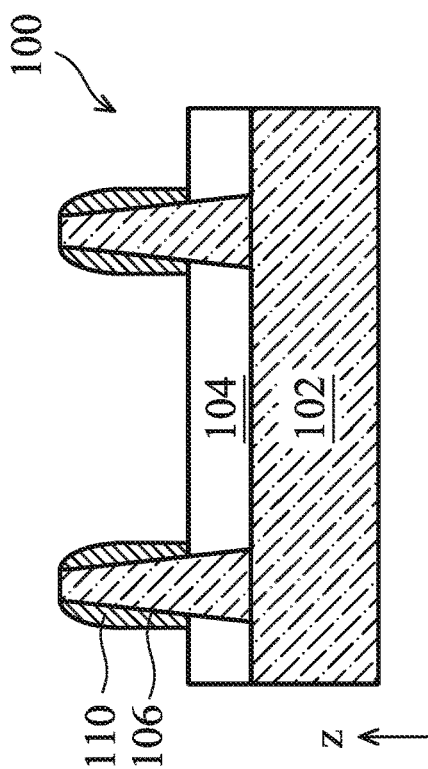
Figure 5C:
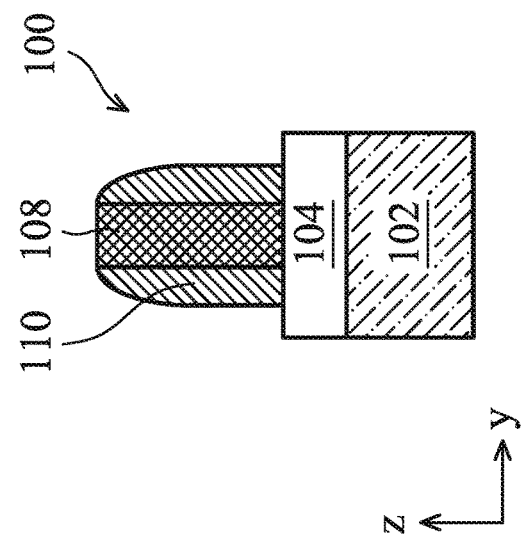

At operation 204, the method 200 (FIG. 2) forms the dielectric layer 110 on sidewalls of the fins 106 in the respective S/D regions 106a. FIGS. 5A, 5B, and 5C illustrate cross-sectional views of the device 100 along the "1-1," "2-2," and "3-3" lines of FIG. 3 respectively after this fabrication step. Referring to FIGS. 5A, 5B, and 5C, the dielectric layer 110 may comprise a single layer or multi-layer structure, and may comprise a dielectric material such as silicon nitride (SiN) or silicon oxynitride. The dielectric layer 110 may be formed by CVD, PECVD, ALD, thermal deposition, or other suitable methods. In the present embodiment, the dielectric layer 110 is also disposed on sidewalls of the gate stack 108. In an embodiment, operation 204 includes a deposition process followed by an etching process. For example, it may deposit a dielectric material over the device 100 as a blanket layer, covering the isolation structure 104, the fins 106, and the gate stack 108. Then, it may perform an anisotropic etching process to remove portions of the dielectric material from top surfaces of the isolation structure 104, the fins 106, and the gate stack 108, leaving remaining portion of the dielectric material on sidewalls of the fins 106 and the gate stack 108 as the dielectric layer 110. In embodiments, the dielectric layer 110 on the sidewalls of the fins 106 has a height of approximately 5 to 25 nm.

Figure 6B:
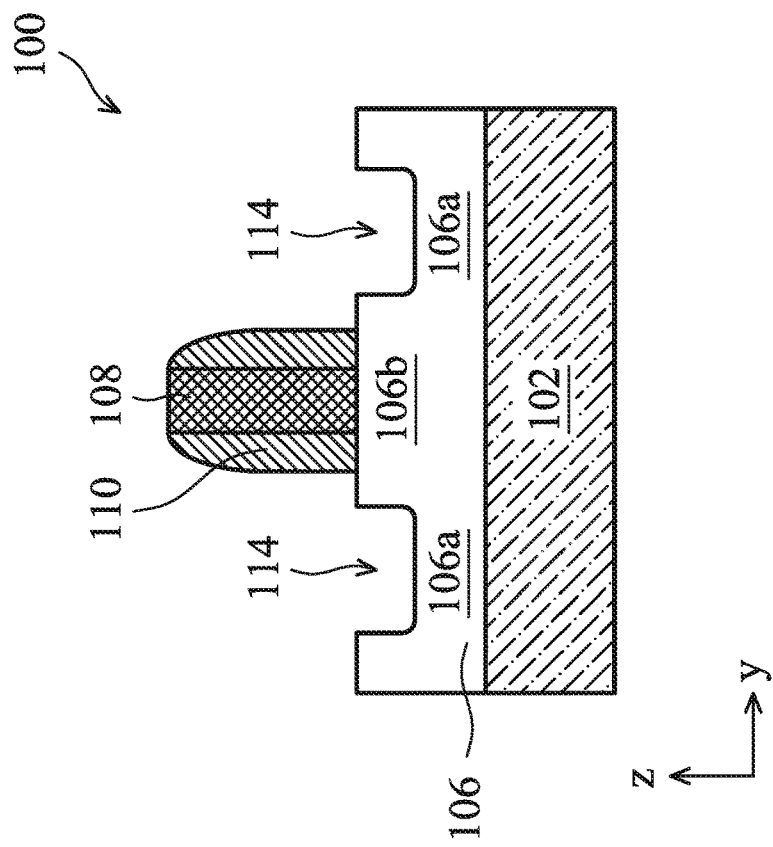
Figure 6A:
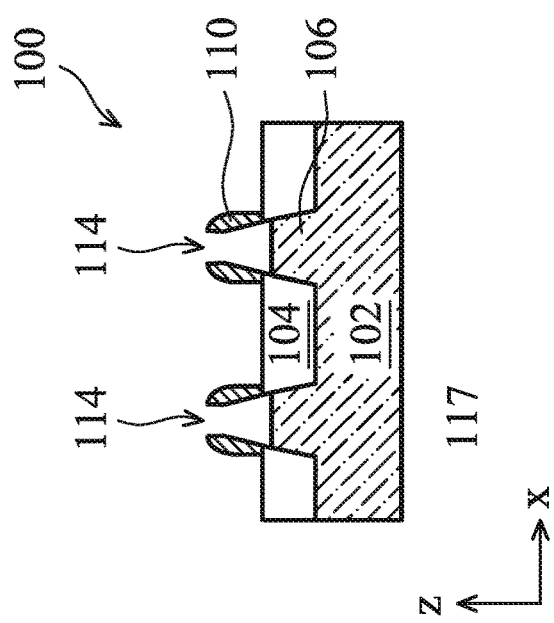

At operation 206, the method 200 (FIG. 2) selectively etches the S/D regions 106a of the fins 106 to form trenches (or recesses) 114 therein. FIGS. 6A and 6B illustrate cross-sectional views of the device 100 along the "1-1" and "2-2" lines of FIG. 3 respectively after this fabrication step. Referring to FIGS. 6A and 6B, the fins 106 are etched below a top surface of the isolation structure 104 in this embodiment. Operation 206 may include one or more photolithography process and etching processes. For example, the photolithography process may form a masking element covering areas of the device 100 that are not intended to be etched. The masking element provides openings through which the fins 106 are etched. The fins 106 may be etched by a dry etching process, a wet etching process, or other etching techniques. In the present embodiment, the etching process is selectively tuned to remove the materials of the fins 106 while the gate stack 108, the dielectric layer 110, and the isolation structure 104 remain substantially unchanged. Operation 206 forms four trenches 114 with two on each side of the gate stack 108. Each trench 114 may have a tapered cross-sectional profile (in the "x-z" plane) with a wider opening at its bottom than at its top. After the etching process, a cleaning process may be performed that cleans the trenches 114 with a cleaning chemical to make the various surfaces therein ready for a subsequent epitaxial growth process. The cleaning chemical may be a hydrofluoric acid (HF) solution, a diluted HF solution, or other suitable cleaning solutions.

Figure 7B:
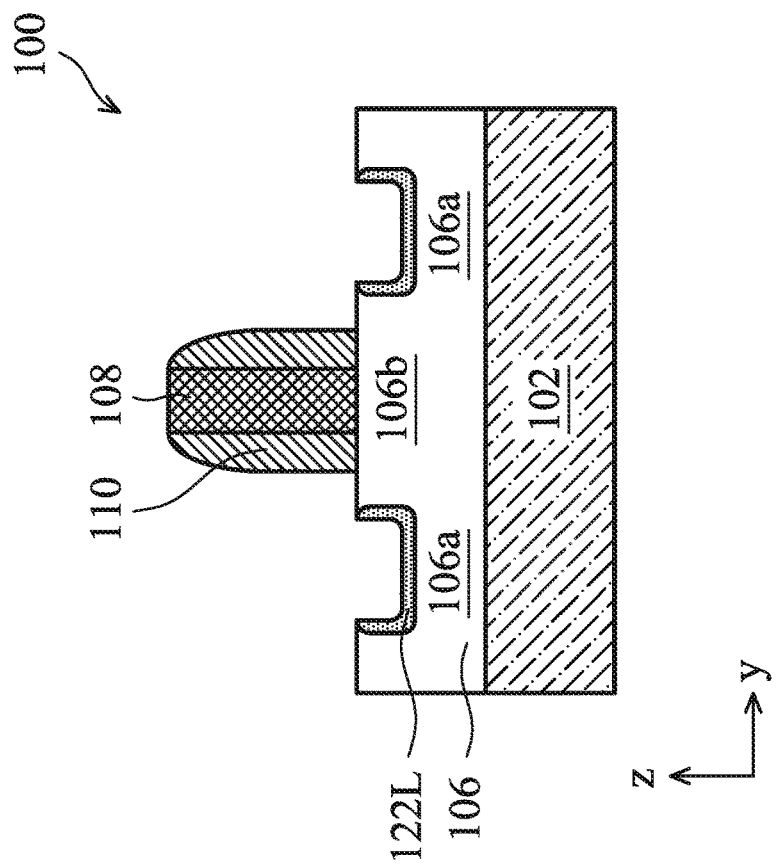
Figure 7A:
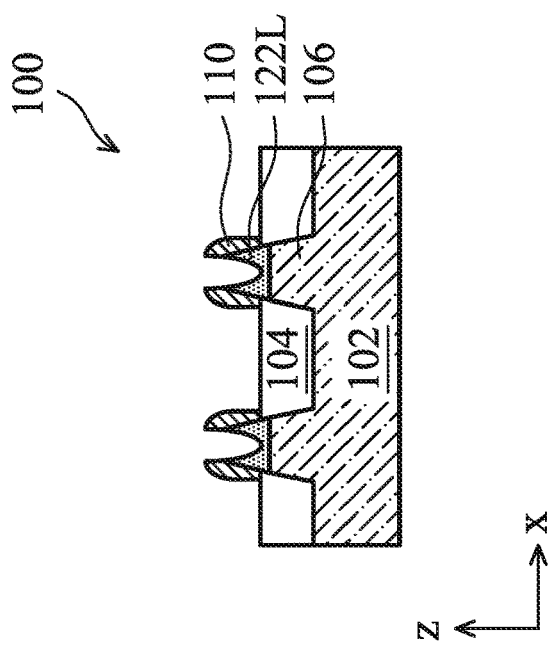

At operation 208, the method 200 (FIG. 2) grows four epitaxial features 122L in the four trenches 114, with one in each trench (FIGS. 7A and 7B). The epitaxial features 122L partially fill the respective trenches 114. The epitaxial growth process may be a LPCVD process with a silicon-based precursor, a selective epitaxial growth (SEG) process, or a cyclic deposition and etching (CDE) process. For example, silicon crystal may be grown with LPCVD with dichlorosilane ($SiH_2Cl_2$) as the precursor. For another example, silicon germanium crystal may be formed with a CDE process using hydrogen chloride (HCl) as the etching gas and a gas mixture of germane ($GeH_4$) and hydrogen ($H_2$) as the deposition gas which contains about 1% to about 10% $GeH_4$ in $H_2$. The height of the dielectric layer 110 is tuned to promote the growth of the epitaxial features 122L to a desirable height without too much lateral growth. In various embodiments, the epitaxial features 122L are grown to have a height ranging from 3 to 15 nm. The epitaxial features 122L include a semiconductor material suitable for forming raised S/D features. In an embodiment, the epitaxial features 122L include silicon germanium (SiGe) doped with one or more p-type dopants, such as boron or indium. In an embodiment, the epitaxial features 122L include silicon doped with one or more n-type dopants, such as phosphorus or arsenic. The doping may be performed in-situ or ex-situ with the epitaxial growth process.

At operation 210, the method 200 (FIG. 2) grows the upper epitaxial features 122U over the lower epitaxial features 122L (FIGS. 8A and 8B). In the present embodiment, the epitaxial features 122U are grown with the same semiconductor material as in the epitaxial features 122L but with different dopant concentration. For example, the epitaxial features 122L and 122U may each include silicon doped with an n-type dopant but the epitaxial features 122U have a higher concentration of the n-type dopant. For another example, the epitaxial features 122L and 122U may each include silicon germanium doped with a p-type dopant but the epitaxial features 122U have a higher concentration of the p-type dopant. Similar to the formation of the epitaxial features 122L, the epitaxial features 122U may be formed using LPCVD, SEG, or CDE techniques. FIGS. 8A and 8B are cross-sectional views of the device 100 along the "1-1" and "2-2" lines, respectively, of FIG. 3 at this fabrication stage.

As shown in FIGS. 8A and 8B, the epitaxial features 122U fill the remaining spaces in the respective trenches 114 and further expand laterally once they grow out of the respective trenches 114. Because the growth rate of the epitaxial feature 122 is different along different crystal directions (e.g., the [100], [111], and [110] directions of silicon crystal), as the epitaxial features 122U grow taller and wider, they start to merge, as shown in FIG. 8A. Referring to FIG. 8A, the epitaxial features 122U merge into a connected epitaxial feature, also referred to as the epitaxial feature 122U for the convenience of discussion. The merged portion of the epitaxial feature 122U has a vertical thickness "t" at approximately middle of the epitaxial feature 122U, and has a side expansion of $s_1$ on both sides opposite the merged portion. The side expansion $s_1$ is measured from the sidewall of the trench 114 (FIG. 6A) along the "x" direction.

At this fabrication stage, the epitaxial feature 122U does not have a flat top surface and a shallow arc-like bottom surface. Instead, it has a curvy top surface 115 with a dip 116, and a pointed or concave bottom surface 117 with a large height-to-span ratio. For example, the height-to-span ratio of the shape 117 is greater than 0.5. The inventors of the present disclosure have discovered that growing the epitaxial feature 122U under the same epitaxial growth condition may not result in its having a flat top surface and a shallow arc-like bottom surface.

Figures 9A, 9B:
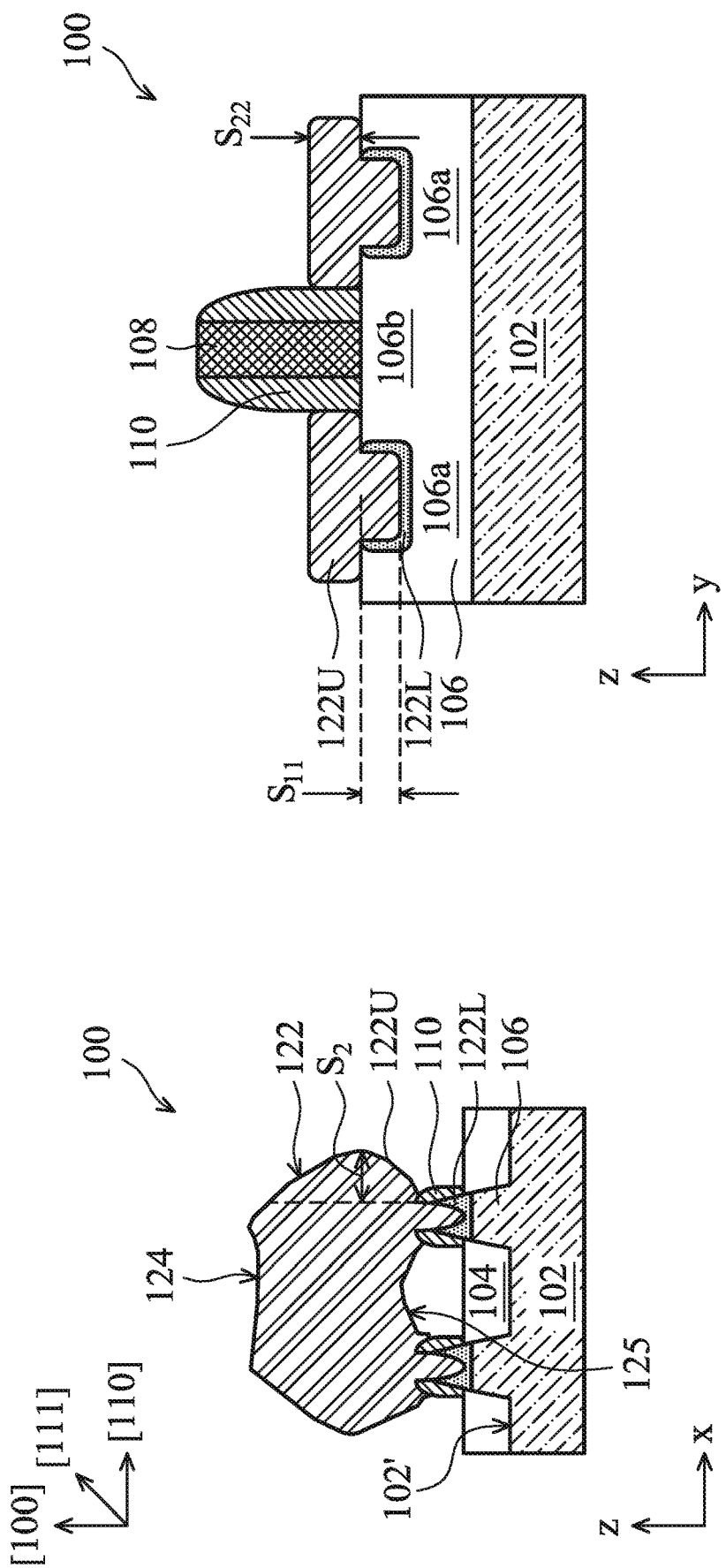

At operation 212, the method 200 (FIG. 2) changes the growth condition for the epitaxial feature 122U and continues growing the epitaxial feature 122U to have a substantially flat top surface 124 and a shallow arc-like bottom surface 125 as shown in FIG. 9A, which is a cross-sectional view of the device 100 along the "1-1" line of FIG. 3. FIG. 9B illustrates a cross-sectional view of the device 100 along the "2-2" line of FIG. 3 at this fabrication stage. The epitaxial feature 122U has a height $S_{11}$ below a top surface of the fin 106 and a height $S_{22}$ above the top surface of the fin 106. The height $S_{11}$ may be greater than, less than, or equal to the height $S_{22}$ in various embodiments. In an embodiment, the height $S_{11}$ ranges from 45 to 65 nm. In an embodiment, the method 200 switches from operation 210 to operation 212 when the merged portion of the epitaxial feature 122U reaches a target dimension, for example, when its lateral dimension along the "x" direction reaches a certain value (e.g., at least 1.5 times of the pitch "p") or when its vertical thickness "t" reaches into a target range of dimension, such as from 5 to 10 nm.

In an embodiment, operation 212 uses a different deposition precursor or a different etching gas than operation 210 does. In another embodiment, operation 212 uses a different (in type or amount) etching gas than operation 210 does but with the same deposition precursor. In yet another embodiment, operation 212 is performed at a different temperature than the operation 210. The growth condition in operation 212 results in a greater growth rate ratio between the crystal directions [100] and [111] than that in operation 210. For example, operation 210 may be tuned to favor the growth of the crystal direction [111] so as to form the merged portion of the epitaxial feature 122, while operation 212 may be tuned to favor the growth of the crystal direction [100] to fill the dip 116 and the concave shape 117 (FIG. 8A). The inventors of the present disclosure have discovered various conditions that achieve the above purposes. For example, they have found that when the temperature is between 650 and 720 degrees Celsius, the growth rate of the silicon crystal along the [100] direction is greater than or equal to the growth rate of the silicon crystal along the [111] direction. Some other growth conditions are discussed below.

In an embodiment, operation 210 grows the epitaxial features 122U using dichlorosilane ($SiH_2Cl_2$) (also known as DCS) as a precursor to form silicon crystal. To further this embodiment, operation 212 adds a silane to the precursor in order to have a higher growth (or deposition) rate in the silicon crystal [100] direction. In an embodiment, the silane is $SiH_4$. In an embodiment, the ratio of $SiH_4$ to DCS in operation 212 ranges from about 0.005 to about 0.05. In another embodiment, both operations 210 and 212 use HCl as an etching gas, and operation 212 reduces the flow rate of the HCl gas to reduce its etching effects on the crystal [100] direction.

In another embodiment, operation 210 grows the epitaxial features 122U using a gas mixture of GeH$_4$ and H$_2$ as the deposition gas and HCl as the etching gas so as to form silicon germanium crystal. To further this embodiment, operation 212 reduces the flow rate of the HCl so that silicon germanium is grown faster in the [100] direction than in other directions. In an embodiment, the HCl flow rate in operation 212 ranges from about 100 to about 400 standard cubic centimeters per minute (sccm).

In various embodiments, the operations 210 and 212 may be performed at a pressure ranging from 200 to 350 Torr.

By virtue of the operations 208, 210, and 212, the device 100 is provided with raised S/D features 122 which have a shallow arc-like bottom surface 125 and a flat or nearly flat top surface 124. The shallow arc-like bottom surface 125 may be in any one of the shape as illustrated in FIGS. 1A-1D.

In an embodiment, the height of the sidewall dielectric layer 110 can also be used to control the vertical volume of the upper portion 122U (see discussion in operation 204). For example, when the sidewall dielectric layer 110 is lower, the upper portions 122U merge earlier, resulting in a greater thickness along the "z" direction. On the other hand, when the sidewall dielectric layer 110 is higher, the upper portions 122U merge later, resulting in a smaller thickness along the "z" direction.

Still referring to FIG. 9A, the epitaxial feature 122U expands laterally during the operation 212 in some embodiments. For example, its side dimension "s$_2$" becomes greater than "s$_1$." This is because the growth condition in operation 212 of these embodiments does not totally inhibit the growth of the epitaxial feature 122 along the crystal [110] direction. In some instances, this side expansion is undesirable because it might short adjacent S/D regions, creating device failures. For example, when the epitaxial feature 122 is part of an SRAM cell, the device density can be high and the space between adjacent SRAM cells may need to be tightly controlled. In the present embodiment, the method 200 (FIG. 2) perform operation 214 to trim the side dimension of the epitaxial feature 122.

Figure 10A:
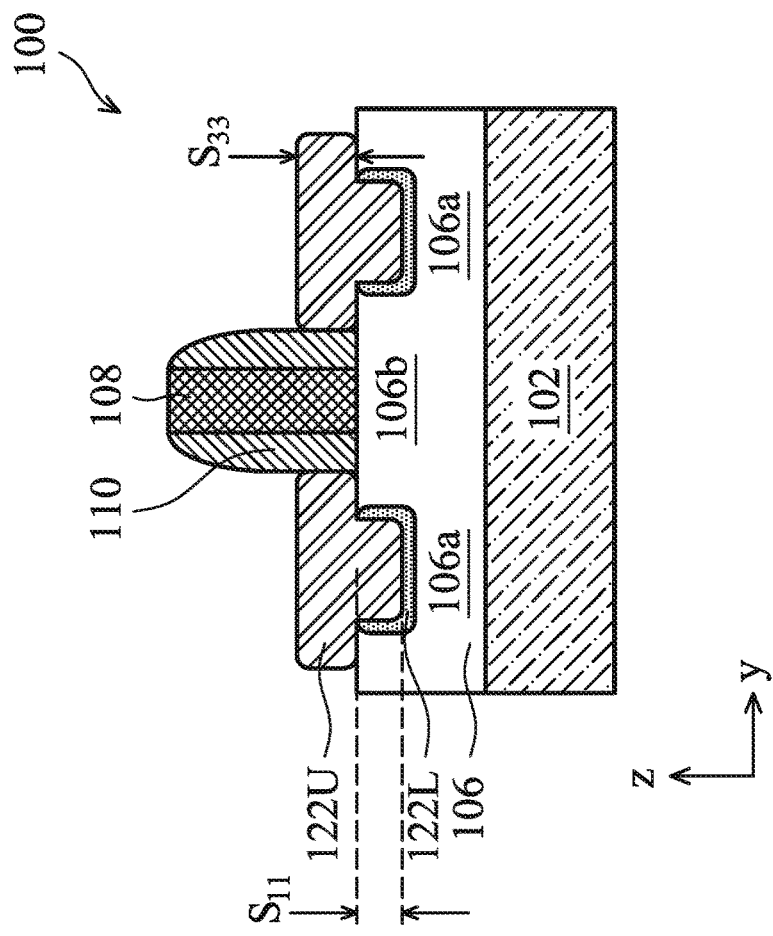
Figure 10B:
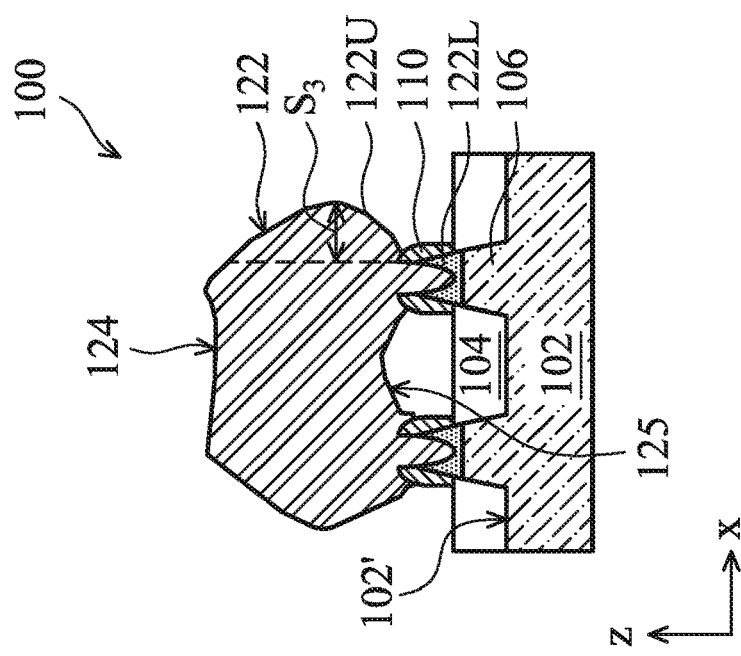

In an embodiment, operation 214 performs an etching process to the device 100. The etching process is tuned to reduce the width of the epitaxial feature 122 (along the "x" direction) without much impact to the thickness of the epitaxial feature 122 (along the "z" direction). In an embodiment, the etching process uses a mixture of GeH$_4$ gas and HCl gas as the etchant. In a further embodiment, the ratio between GeH$_4$ and HCl in the etchant is tuned to range from 0.5 to 1.2. For example, the ratio between GeH$_4$ and HCl can be tuned by controlling the flow rates of GeH$_4$ gas and HCl gas introduced into the process chamber to be in a range from 0.5 to 1.2. The etching process may be performed in-situ in the same process chamber where the epitaxial growth of the feature 122 is performed. In an alternative embodiment, the etching process may be performed ex-situ. In an embodiment, the etching process may be performed at a temperature in a range from 650 to 750 degrees Celsius and at a pressure of 5 to 100 torr. In various embodiments, the etchant chemistry, temperature, and pressure of operation 214 are all tuned to reduce the width of the epitaxial feature 122 without significant reduction to the thickness of the epitaxial feature 122. As a result, the side dimension of the epitaxial feature is reduced to "s$_3$" as shown in FIG. 10A (s$_3$<s$_2$). In an embodiment, the side dimension s$_3$ becomes even smaller than the side dimension s$_1$ (s$_3$<s$_1$). Further, at this fabrication stage, the height of the epitaxial feature 122U above the top surface of the fin 106 may shrink from S$_{22}$ to S$_{33}$, i.e. S$_{33}$<S$_{22}$, due to the etching process. In an embodiment, S$_{33}$ ranges from 3 to 12 nm.

At operation 216, the method 200 (FIG. 2) performs further processes to the device 100. This includes a variety of processes. In one example, silicidation or germano-silicidation are formed on the epitaxial feature 122U. For example, silicidation, such as nickel silicide, may be formed by depositing a metal layer over the epitaxial feature 122U, annealing the metal layer such that the metal layer reacts with silicon in the epitaxial features 122U to form the metal silicidation, and thereafter removing the non-reacted metal layer.

Figure 11B:
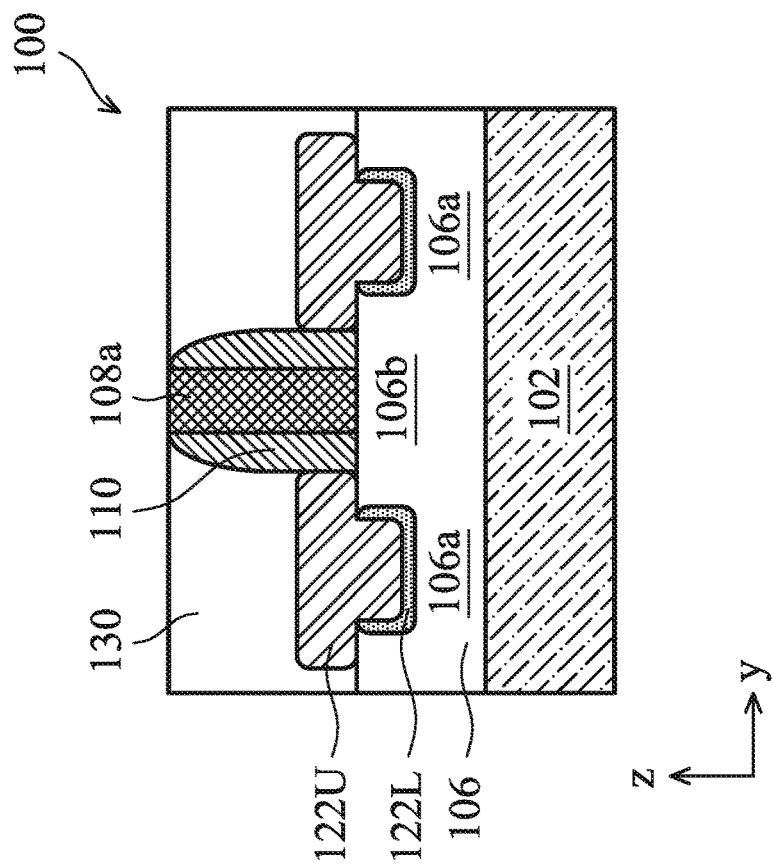
Figure 11A:
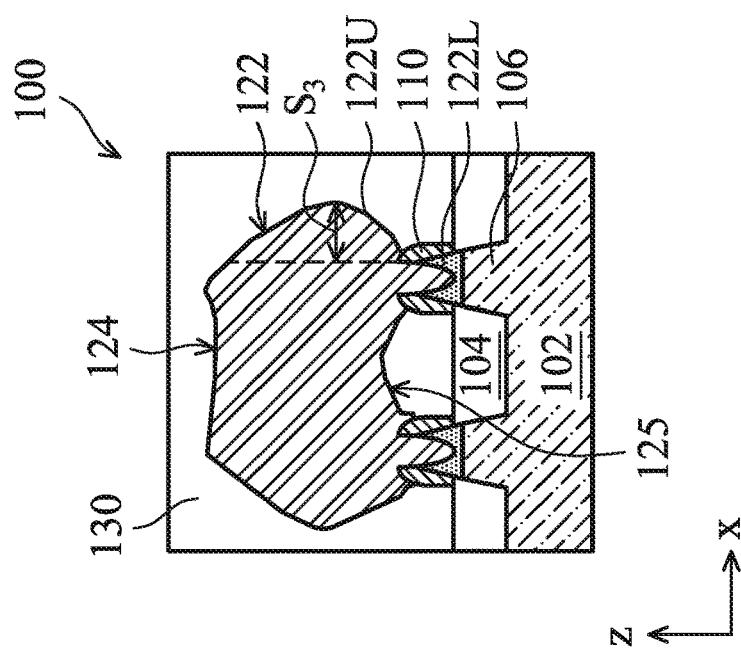

In another example, operation 216 replaces the gate stack 108 with a final gate stack 108a as shown in FIG. 11B. To further this example, the gate stack 108 in FIGS. 3-10B is a placeholder having a dummy gate dielectric layer (e.g., silicon oxide) and a dummy gate electrode layer (e.g., polysilicon), while the gate stack 108a is a high-k metal gate including a high-k gate dielectric layer, an appropriate n-type or p-type work function layer, and a metal fill layer. The high-k gate dielectric layer, the work function layer, and the metal fill layer may use the suitable materials discussed with reference to FIG. 3. To further this example, operation 216 may deposit an inter-layer dielectric (ILD) layer 130 over the substrate 102 to cover the topography thereon (see FIGS. 11A and 11B). The ILD layer 130 may include materials such as tetraethylorthosilicate (TEOS) oxide, doped or un-doped silicate glass, fused silica glass (FSG), and/or other suitable dielectric materials. The ILD layer 130 may be deposited by a PECVD process, flowable CVD (FCVD), or other suitable deposition technique. In some embodiments, the ILD layer 130 may fill the space between the arc-like bottom surface 125, the isolation structure 104, and two opposing fin sidewall dielectric layers 110. In alternative embodiments, the ILD layer 130 may not be able to flow into that space, resulting in a void (or open space) underneath the arc-like bottom surface 125. In some embodiment, a contact etch stop layer (not shown) having a dielectric material such as silicon nitride may be deposited over the epitaxial feature 122 and the isolation structure 104 prior to the deposition of the ILD layer 130. After the ILD layer 130 has been deposited, operation 216 removes the gate stack 108 using one or more etching processes and forms the final gate stack 108a in place of the gate stack 108 using one or more deposition processes, resulting in the device 100 as shown in FIGS. 11A and 11B.

Figure 12B:
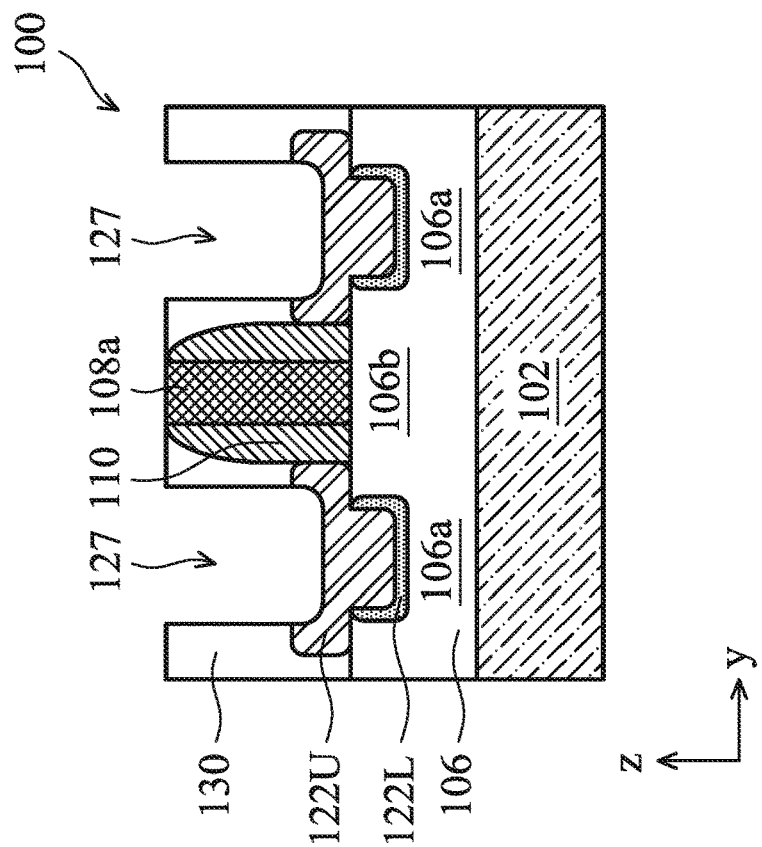
Figure 12A:
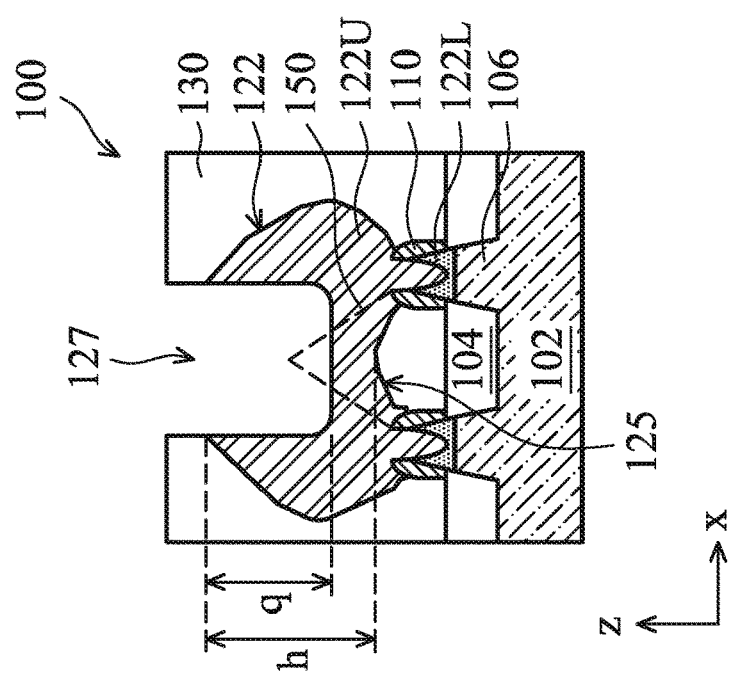
Figure 13A:
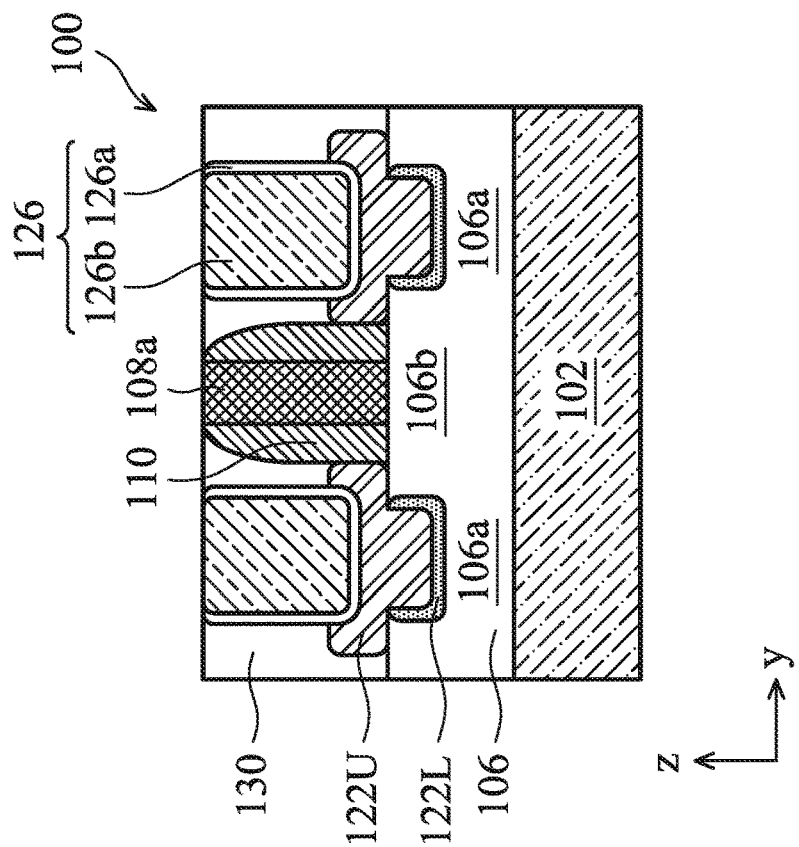
Figure 13B:
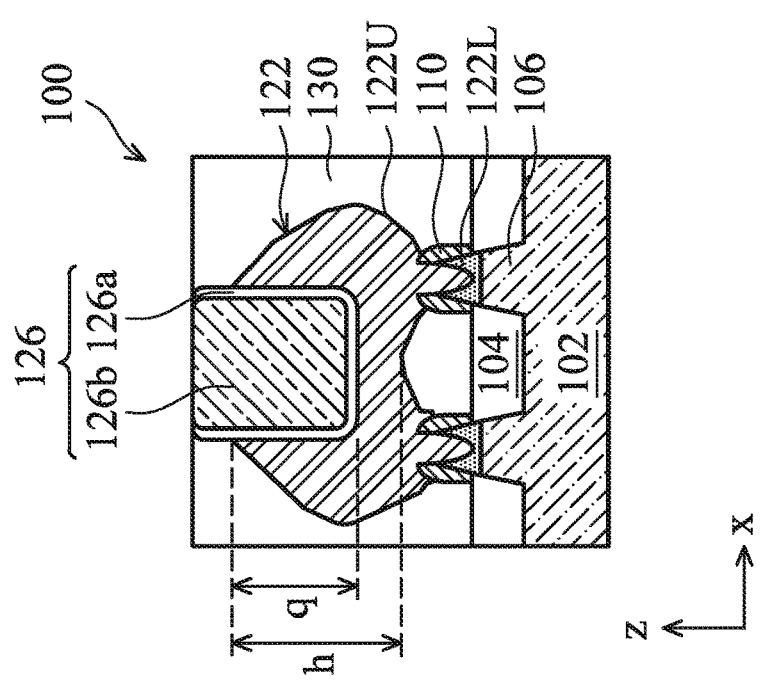

In a further example, operation 216 forms the conductive feature 126 partially embedded in the epitaxial features 122U as shown in FIGS. 13A and 13B. This involves a variety of processes. For example, operation 216 may perform one or more lithography processes and etching processes to form trenches (or contact holes) 127 through the ILD layer 130, such as shown in FIGS. 12A and 12B. The trenches 127 expose the epitaxial features 122U (or the silicidation or germano-silicidation thereon if a silicidation process has been performed on the epitaxial features 122U). In the present embodiment, the trenches 127 extend into the epitaxial features 122U to a depth "q." In a high density IC, the aspect ratio of the device topography (e.g., the ratio between the height of the gate stack 108a and the distance between adjacent gate stacks) can be high, such as well over 10:1. To ensure a good contact between the conductive feature 126 and the epitaxial feature 122 across a wide area of an IC, certain over-etching is desirable when forming the trenches 127. For example, the trench depth "q" may range from 15 to 25 nm at certain locations of the IC. In a conventional device where the bottom surface of the epitaxial feature is a pointed vault (as illustrated by the dashed line 150 of FIG. 12A), the trenches 127 would go through the epitaxial feature. This would reduce the interfacial area between the conductive feature 126 and the conventional epitaxial feature. In the present embodiment, the epitaxial feature 122 is formed to have a shallow arc-like bottom surface 125, which advantageously increases the thickness "h" of the epitaxial feature 122. In various embodiments, the thickness "h" is designed to be greater than the trench depth "q." For example, the thickness "h" is designed to be 25 nm or more. In an embodiment, the operation 216 may further form silicidation or germano-silicidation over the exposed portion of the epitaxial feature 122U. For example, silicidation may be formed by depositing a metal layer (e.g., nickel) over the exposed portion of the epitaxial feature 122U, annealing the metal layer such that the metal layer reacts with silicon in the epitaxial features 122U to form the metal silicidation, and thereafter removing the non-reacted metal layer.

Then, operation 216 deposits a barrier layer 126a on bottom and sidewalls of the trenches 127 (with or without silicidation in different embodiments) to prevent metal materials of the conductor 126b from diffusing into adjacent features. The barrier layer includes a dielectric material, such as TaN or TiN in one example. Subsequently, operation 216 deposits a conductor (e.g. a metal) 126b to fill the remaining spaces in the trenches 127. The conductive feature 126 includes the barrier layer 126a and the conductor 126b in this embodiment. The deposition of the barrier layer and the metal layer may use a conformal or non-conformal deposition process. A large interface between the conductive feature 126 and the underlying epitaxial features 122U results from the large volume of the epitaxial feature 122U, which advantageously reduces the S/D contact resistance. Forming the structure as shown in FIG. 1E can be similarly performed.

Although not intended to be limiting, one or more embodiments of the present disclosure provide many benefits to a semiconductor device and the formation thereof. For example, raised S/D features can be grown to have a shallow arc-like bottom surface and a substantially flat top surface. This advantageously increases the volume of the raised S/D features to withstand certain over-etching in subsequent fabrication steps. A substantial effect is that the interfacial area between conductive features (e.g., S/D contacts or S/D interconnect lines) and the raised S/D features is increased and the contact resistance is reduced. Various embodiments of the present disclosure may be easily integrated into existing manufacturing processes.

In one exemplary aspect, the present disclosure is directed to a semiconductor device. The semiconductor device includes a substrate, two semiconductor fins over the substrate, and a semiconductor feature over the two semiconductor fins. The semiconductor feature comprises two lower portions and one upper portion. The two lower portions are directly over the two semiconductor fins respectively. The upper portion is over the two lower portions. A bottom surface of the upper portion has an arc-like cross-sectional shape.

In another exemplary aspect, the present disclosure is directed to a semiconductor device. The semiconductor device includes a substrate, two semiconductor fins over the substrate, and a semiconductor feature over the two semiconductor fins. The semiconductor feature includes two lower portions and one upper portion. The two lower portions are over the two semiconductor fins respectively. The upper portion is over the two lower portions and physically connects the two lower portions. A bottom surface of the upper portion has an arc-like shape in a plane perpendicular to a fin length direction. The semiconductor device further includes a dielectric layer over the substrate, wherein the two lower portions of the semiconductor feature are surrounded at least partially by the dielectric layer.

In another exemplary aspect, the present disclosure is directed to a method of forming a semiconductor device. The method includes providing a device comprising a substrate and two fins extending from the substrate; etching the two fins, thereby forming two trenches; epitaxially growing first semiconductor features in the two trenches; and epitaxially growing second semiconductor features over the first semiconductor features in a first growth condition, wherein the second semiconductor features laterally merge to form a merged portion. The method further includes, after a dimension of the merged portion reaches a target dimension, epitaxially growing the second semiconductor features in a second growth condition, wherein a growth rate ratio between crystal directions [100] and [111] of the second semiconductor features is greater in the second growth condition than in the first growth condition.

In another exemplary aspect, the present disclosure is directed to a method of forming a semiconductor device. The method includes providing a device having a substrate and at least two fins extending from the substrate. The method further includes etching the at least two fins, thereby forming at least two trenches; and epitaxially growing first semiconductor features in the at least two trenches. The method further includes epitaxially growing second semiconductor features over the first semiconductor features in a first growth condition, wherein the second semiconductor features laterally merge, thereby forming a merged portion. After a thickness of the merged portion reaches a target dimension, the method further includes epitaxially growing the second semiconductor features in a second growth condition different from the first growth condition, thereby forming an arc-like shape in a bottom surface of the merged portion. The method further includes performing an etching process to reduce a width of the second semiconductor features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a first fin and a second fin extending from the semiconductor substrate;
   a first lower semiconductor feature over the first fin;
   a second lower semiconductor feature over the second fin, wherein each of the first and second lower semiconductor features includes a top surface bending downward towards the semiconductor substrate;
   an upper semiconductor feature over and in physical contact with the first and second lower semiconductor features, wherein the upper semiconductor feature has a different dopant concentration than the first and second lower semiconductor features; and a dielectric layer on sidewalls of the first and second lower semiconductor features.

2. The semiconductor device of claim 1, wherein a bottom surface of the upper semiconductor feature is substantially parallel to a top surface of the semiconductor substrate.

3. The semiconductor device of claim 1, wherein a bottom surface of the upper semiconductor feature has a curvature shape extending downward towards the semiconductor substrate.

4. The semiconductor device of claim 1, wherein a bottom surface of the upper semiconductor feature has a curvature shape extending upward away from the semiconductor substrate.

5. The semiconductor device of claim 1, wherein the upper semiconductor feature extends partially through each of the first and second lower semiconductor features.

6. The semiconductor device of claim 1, wherein each of the first and second lower semiconductor features has a portion sandwiched between the dielectric layer and the upper semiconductor feature.

7. The semiconductor device of claim 1, wherein each of the first and second lower semiconductor features and the upper semiconductor feature comprises silicon with an n-type dopant.

8. The semiconductor device of claim 1, wherein the upper semiconductor feature has a higher dopant concentration than the first and second lower semiconductor features.

9. The semiconductor device of claim 1, wherein the upper semiconductor feature is a first upper semiconductor feature, further comprising:
  a third fin extending from the semiconductor substrate; and
  a second upper semiconductor feature over the third fin, wherein the first and second upper semiconductor features comprise different semiconductor materials.

10. A semiconductor device, comprising:
  a substrate;
  first and second semiconductor fins over the substrate;
  a semiconductor feature over the first and second semiconductor fins, wherein the semiconductor feature comprises two lower portions and one upper portion, the two lower portions are directly over the first and second semiconductor fins respectively, and the upper portion is over top surfaces of the two lower portions, and wherein the upper portion has a bottom surface bended upwardly with an apex located between the first and second semiconductor fins; and
  a conductor partially embedded in the upper portion of the semiconductor feature, wherein the conductor is in contact with a top surface and at least one external sidewall surface of the upper portion of the semiconductor feature.

11. The semiconductor device of claim 10, wherein the lower portions of the semiconductor feature comprise silicon with a first concentration of a dopant, the upper portion of the semiconductor feature comprises silicon with a second concentration of the dopant, and the second concentration is higher than the first concentration.

12. The semiconductor device of claim 11, wherein the dopant is an n-type dopant.

13. The semiconductor device of claim 10, wherein the semiconductor feature is a first semiconductor feature, further comprising:
  a third semiconductor fin over the substrate; and
  a second semiconductor feature over the third semiconductor fin, wherein the conductor is also partially embedded in an upper portion of the second semiconductor feature.

14. The semiconductor device of claim 13, wherein the conductor is in contact with a top surface and at least one external sidewall surface of the upper portion of the second semiconductor feature.

15. The semiconductor device of claim 13, wherein the second semiconductor feature has a rhombus shape.

16. A semiconductor device, comprising:
  a substrate;
  first, second, and third semiconductor fins over the substrate; and
  first, second, and third semiconductor features over the first, second, and third semiconductor fins, respectively, wherein each of the first, second, and third semiconductor features includes a lower portion and an upper portion that has a dopant concentration different from the lower portion, and wherein the upper portions of the second and third semiconductor features merge.

17. The semiconductor device of claim 16, wherein the first semiconductor feature comprises a first semiconductor material, each of the second and third semiconductor features comprises a second semiconductor material that is different from the first semiconductor material.

18. The semiconductor device of claim 16, wherein the upper portion of each of the first, second, and third semiconductor feature is partially embedded in the respective lower portion.

19. The semiconductor device of claim 16, further comprising:
  a conductor that electrically connects the upper portions of the first, second, and third semiconductor features.

20. The semiconductor device of claim 10, further comprising:
  a dielectric layer on sidewalls of the two lower portions of the semiconductor feature, wherein the two lower portions of the semiconductor feature have bottom surfaces below a bottommost portion of the dielectric layer.

* * * * *